United States Patent
Feng et al.

(10) Patent No.: US 8,507,362 B2
(45) Date of Patent: Aug. 13, 2013

(54) PROCESS OF FORMING ULTRA THIN WAFERS HAVING AN EDGE SUPPORT RING

(75) Inventors: Tao Feng, Santa Clara, CA (US); Sung-Shan Tai, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 107 days.

(21) Appl. No.: 13/115,097

(22) Filed: May 24, 2011

(65) Prior Publication Data

US 2011/0223742 A1    Sep. 15, 2011

Related U.S. Application Data

(62) Division of application No. 11/880,455, filed on Jul. 20, 2007, now Pat. No. 8,048,775.

(51) Int. Cl.
*H01L 21/30* (2006.01)
*H01L 21/46* (2006.01)

(52) U.S. Cl.
USPC .......................................... 438/459; 438/977

(58) Field of Classification Search
USPC ..... 438/459, 977; 451/54, 55; 257/E21.237, 257/E21.484
See application file for complete search history.

(56) References Cited

U.S. PATENT DOCUMENTS 6,162,702 A      12/2000  Morcom et al.
7,727,810 B2 *   6/2010   Arai et al. ..................... 438/113

* cited by examiner

*Primary Examiner* — Hung Vu
(74) *Attorney, Agent, or Firm* — James Cai; Schein & Cai LLP

(57) ABSTRACT

A process of forming ultra thin wafers having an edge support ring is disclosed. The process provides an edge support ring having an angled inner wall compatible with spin etch processes.

2 Claims, 10 Drawing Sheets

PROCESS OF FORMING ULTRA THIN WAFERS HAVING AN EDGE SUPPORT RING

CROSS REFERENCE TO RELATED APPLICATIONS

The instant patent application is a divisional patent application and claims priority to U.S. patent application Ser. No. 11/880,455 filed on Jul. 20, 2007, now U.S. Pat. No. 8,048,775 which is herein incorporated by reference in its entirety and which claims priority to U.S. patent application Ser. No. 11/694,888 filed on Mar. 30, 2007.

BACKGROUND OF THE INVENTION

1. Field of the Invention

The present invention generally relates to semiconductor device fabrication and more particularly to a process of forming ultra thin wafers having an edge support ring.

2. Description of Related Art

Vertical power devices including power MOSFETs and insulated gate bipolar transistors (IGBTs) are being fabricated on ultra thin wafers on the order of less than 4 mils. The fabrication of these power devices on ultra thin wafers provides for devices with reduced electrical and thermal resistances. The use of ultra thin wafers further ensures that the power devices meet stringent total package thickness requirements. Furthermore, ultra thin wafers—including ultra thin float zone wafers—are replacing expensive wafers with an epitaxially formed silicon layer for device junctions and buffer zones.

For ultra thin wafers with thickness smaller than 4 mils, wafer bowing and warping, and/or breakage and fracture occur frequently during handling processes. The prior art generally provides for two wafer thinning and handling approaches. In a first approach, a temporary support substrate such as a handle wafer, a glass substrate, a thick tape, a polymer substrate, and a polymer based composite substrate is applied. Disadvantageously, this first approach requires complex operations when applying and removing the temporary support structure. Some removal processes may involve risk of wafer breakage and fracture. Additionally, adhesives and other polymeric materials used to secure the wafer to the temporary support structure may outgas in the vacuum chamber during metallization and adversely affect the quality of the ohmic contact.

In a second approach, a support ring is formed at a wafer edge to facilitate handling and processing of the ultra thin wafer. This second approach advantageously eliminates the introduction of extraneous materials such as adhesives into the processing of the ultra thin wafer. As disclosed in U.S. Pat. No. 6,162,702 entitled "Self-supported Ultra Thin Silicon Wafer Process", and illustrated in FIGS. 1 and 2, a silicon wafer 2 has an ultra thin central portion 4 that is supported by a circumferential rim 3 of thicker silicon. Removing a volume of silicon from the silicon wafer 2 by a controlled mechanical or physical means such as grinding, milling, drilling or laser forms the ultra thin central portion 4. Alternatively, a mask may be formed on the rim of the silicon wafer 2 and the silicon wafer 2 may be etched to form the ultra thin central portion 4.

With reference to FIGS. 3, 4 and 5, a grinding wheel 30 having teeth 32 is shown for use in grinding a backside 34 of a wafer 31 and forming a thick edge support ring 36 therearound. The grinding wheel 30 has an axis of rotation "G" while the wafer 34 has an axis of rotation "W". Grinding of the wafer backside 34 yields an ultra thin central portion 38 having a thickness less than 4 mils surrounded by the edge support ring 36. The edge support ring is roughly the same thickness as the original wafer. The edge support ring is at least 2 mm wide. The wider the ring, the stronger it is, but also the less space is available to form dies. The edge support ring 36 facilitates the handling of the wafer 31.

Following the back grinding process, it is conventional to spin etch the ultra thin central portion 38 of the wafer 31 before the back metallization process. The spin etch process includes a chemical etch of silicon and oxides followed by cleaning with de-ionized water. The spin etch process increases the mechanical strength of the ultra thin central portion 38 and ensures good ohmic contact between the metal subsequently deposited and the highly doped silicon substrate of the wafer 31. Following the spin etch process, no drying process is necessary before loading the wafer 31 into the vacuum chamber for back metallization.

It has been discovered that the structure of the edge support ring 36 disadvantageously interferes with the spin etch process. As seen in FIG. 6 and indicated by the arrows, rotation of the wafer 31 about the axis of rotation "W" causes the chemical etch and de-ionized water to flow outwardly and encounter a wall 60 of the edge support ring 36 formed at a right angle or nearly a right angle to the plane of the ultra thin central portion 38. The wall 60 prevents the entirety of the chemical etch and de-ionized water from being spun from the wafer 31 during the spin etch process. As such, additional cleaning and/or drying steps are required before the back metallization process can be effectively performed. Alternatively, the wafer 31 may be baked at a high temperature to remove the residual chemical etch and de-ionized water. In either case unacceptable complexity or delays in the fabrication process may be introduced by the structure of the edge support ring 36 of the prior art that additionally may adversely affect the quality of the back metal contact.

There remains a need in the art for a process of forming ultra thin wafers having an edge support ring that overcomes the limitations of the prior art. There is also a need in the art for a process of forming ultra thin wafers having an edge support ring that provides for an edge support ring compatible for use with conventional spin etch processes before back metal deposition. There is a further need for an edge support ring having an angled inner wall.

SUMMARY OF THE INVENTION

The process of forming ultra thin wafers having an edge support ring in accordance with a preferred embodiment of the invention provides a wafer having an edge support ring surrounding an ultra thin central portion of less than 4 mils thickness. The edge support ring has an angled inner wall extending from the ultra thin central portion to a top of the edge support ring. The angled inner wall provides a means by which the chemicals used in the spin etch process are spun from the wafer during spin etch processing.

In accordance with one aspect of the invention, an ultra thin wafer having an edge support ring includes an ultra thin central portion and a peripheral edge support ring, the edge support ring having an angled inner wall.

In accordance with another aspect of the invention, a process of forming an ultra thin wafer having an edge support ring includes the steps of positioning a grinding wheel proximate a wafer backside edge, grinding the wafer backside while gradually reducing a distance between a grinding wheel axis of rotation and a wafer chuck axis of rotation, and ending the grinding of the wafer backside when an ultra thin central portion thickness is achieved.

In accordance with yet another aspect of the invention, a process of forming an ultra thin wafer having an edge support ring includes the steps of positioning a grinding wheel having profiled teeth proximate a wafer backside edge, grinding the wafer backside, and ending the grinding of the wafer backside when an ultra thin central portion thickness is achieved.

In accordance with another aspect of the invention, a process of forming an ultra thin wafer having an edge support ring includes the steps of positioning a first grinding wheel a distance from a wafer backside edge, grinding a wafer backside to form an ultra thin central portion and an edge support ring until an ultra thin central portion thickness is achieved, positioning a second grinding wheel to grind an angled inner wall of the edge support ring, and grinding the edge support ring to form the angled inner wall.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the concept upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
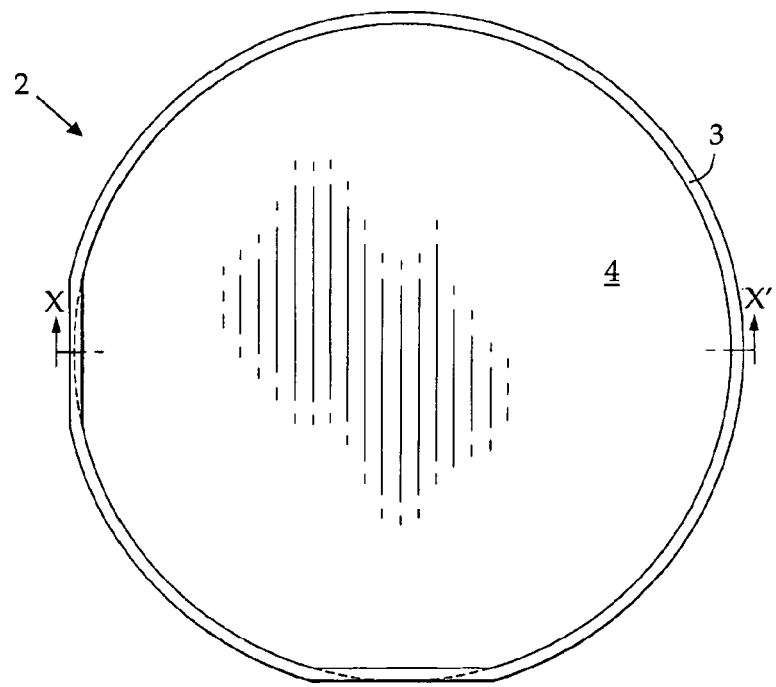
FIG. 1 is a top plan view of a prior art ultra thin wafer having an edge support ring.
Figure 2:
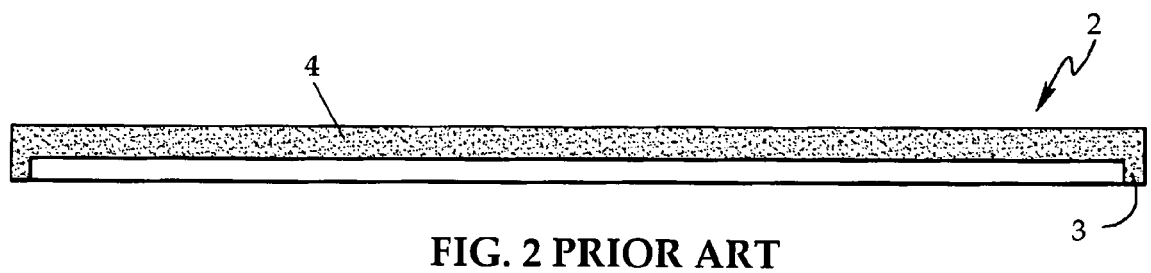
FIG. 2 is cross sectional view of the ultra thin wafer taken along line X-X' of FIG. 1.
Figure 3:
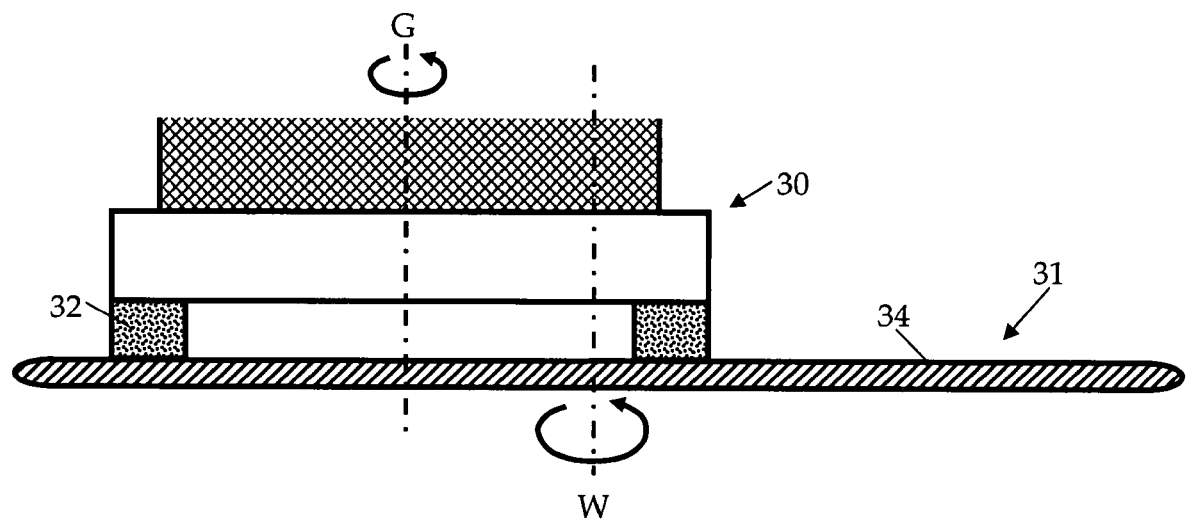
FIG. 3 is a schematic representation showing a grinding wheel for use in grinding a central portion of a wafer.
Figure 4:
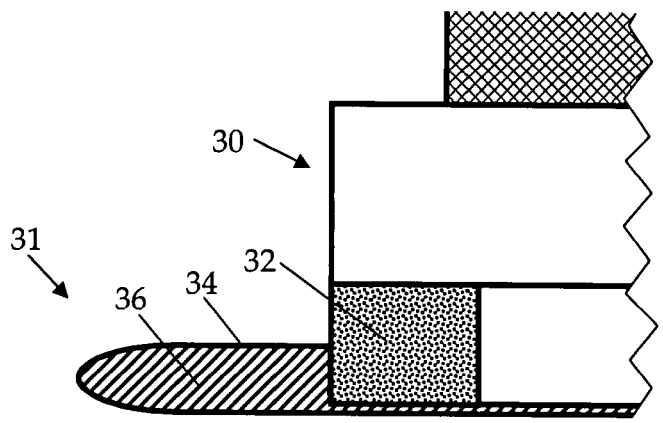
FIG. 4 is a partial side elevation view showing the wafer being ground by the grinding wheel.
Figure 5:
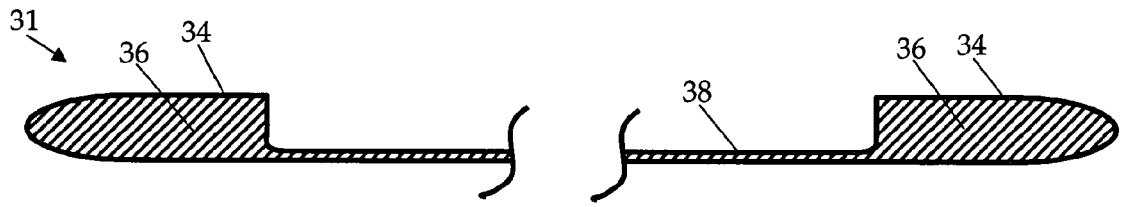
FIG. 5 is a partial side elevation view of the ground wafer including an ultra thin central portion and an edge support ring.
Figure 6:
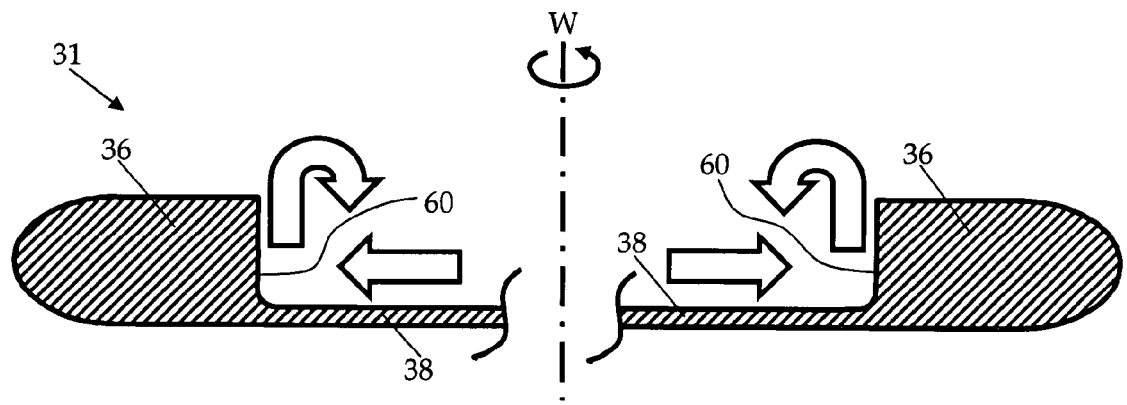
FIG. 6 is a schematic representation showing the flow of spin etch chemicals during a spin etch process.
Figure 7:
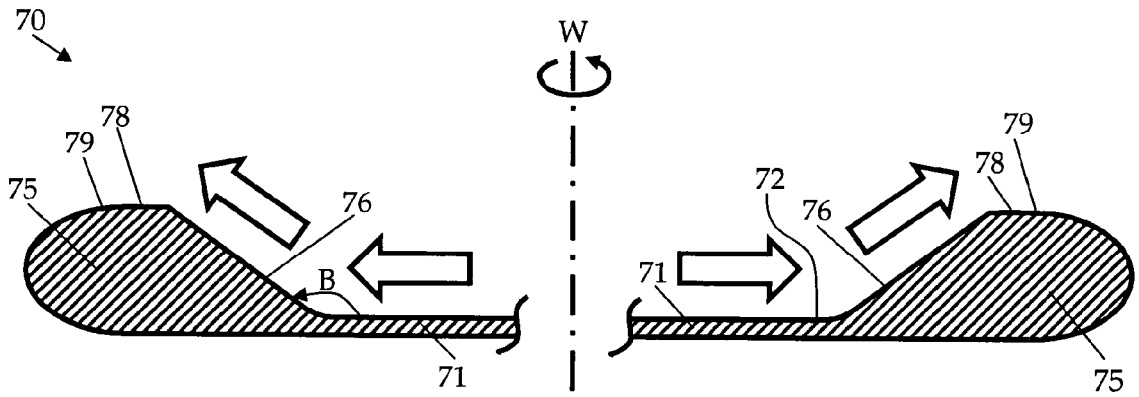
FIG. 7 is a schematic representation showing the flow of spin etch chemicals during a spin etch process in accordance with an aspect of the invention.

In accordance with a first embodiment of the invention and with reference to FIG. 7, a wafer 70 includes an ultra thin central portion 71 and a peripheral edge support ring 75 formed on a backside 79 thereof. A well-defined angle B is formed at a bottom of an angled inner wall 76 of the edge support ring 75 and an edge 72 of the ultra thin central portion 71. Angled inner wall 76 extends upwardly from a plane of the ultra thin central portion 71 to a top 78 of the edge support ring 75. Chemical etch and de-ionized water can be spun from the wafer 70 during the spin etch process as indicated by the arrows. The edge support ring 75 provides the benefits of reduced handling and processing of the wafer 70 during subsequent processing and provides a solution to the problems described in the Background of the Invention section hereof.

Figure 8:
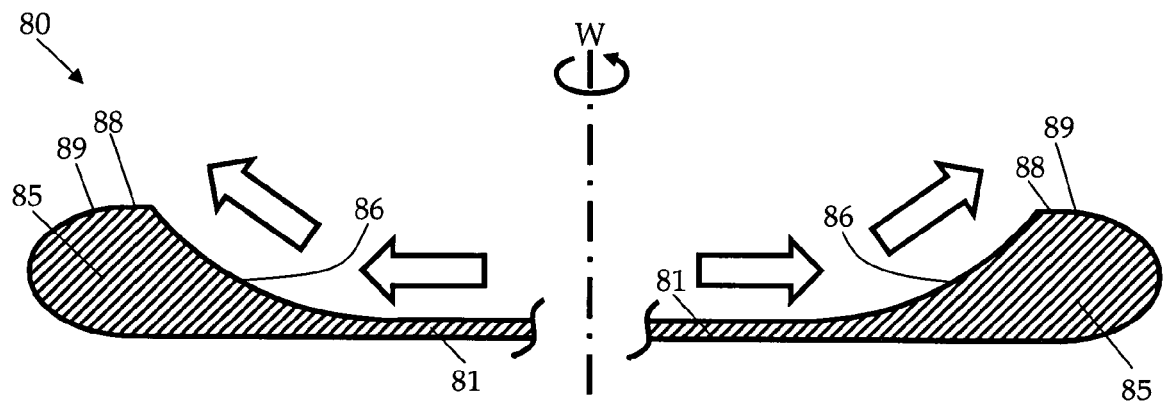
FIG. 8 is a schematic representation showing the flow of spin etch chemicals during a spin etch process in accordance with another aspect of the invention.

In accordance with another embodiment of the invention and with reference to FIG. 8, a wafer 80 includes a substantially non-linear angled inner wall 86 extending and curving upwardly from a plane of an ultra thin central portion 81 to a top 88 of an edge support ring 85 formed on a backside 89 thereof. Chemical etch and de-ionized water can be spun from the wafer 80 during the spin etch process as indicated by the arrows. The edge support ring 85 provides the benefits of reduced handling and processing of the wafer 80 during subsequent processing and provides another solution to the problems described in the Background of the Invention section hereof.

Figure 16:
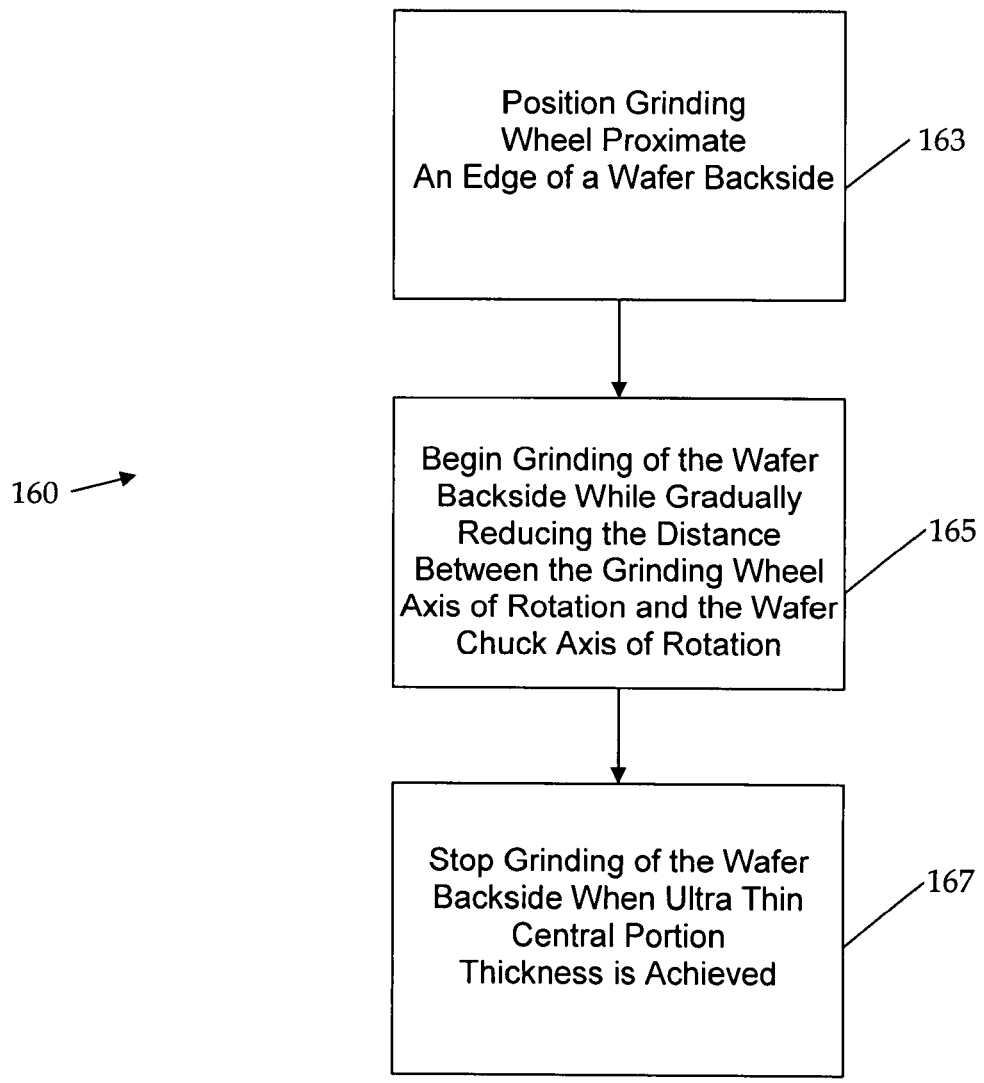
FIG. 16 is a flow chart of a process of forming ultra thin wafers having an edge support ring in accordance with the first aspect of the invention.

In accordance with a first aspect of a process of the invention, a process of forming ultra thin wafers having an edge support ring generally designated 160 is shown in FIG. 16. The process 160 uses a grinding wheel having an axis of rotation and a wafer chuck to which is secured the wafer, the wafer chuck having an axis of rotation. In a preferred embodiment of the invention, the axes of rotation of the grinding wheel and the wafer chuck are parallel. In a step 163 the grinding wheel is positioned proximate an edge of a wafer backside. By starting proximate the edge of the wafer, wafer material at the edge of the wafer is provided to form an edge support ring of substantially the same thickness of the original wafer and at least 2 mm wide. In a step 165 the wafer backside is ground while gradually reducing the distance between the grinding wheel axis of rotation and the wafer chuck axis of rotation. The decrease in the distance may be a function of the feed depth of the grinding wheel or a function of time. In a final step 167, grinding of the wafer backside is stopped when an ultra thin central portion thickness is achieved.

Figure 9:
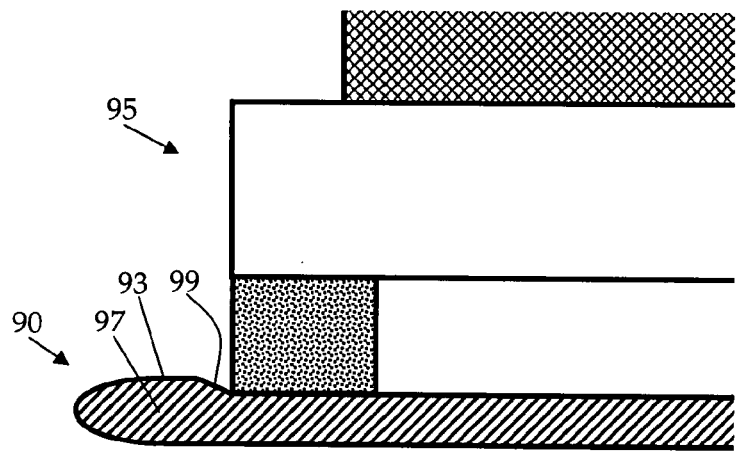
FIG. 9 is a partial side elevation view showing a wafer being ground in accordance with a first aspect of the invention.
Figure 10:
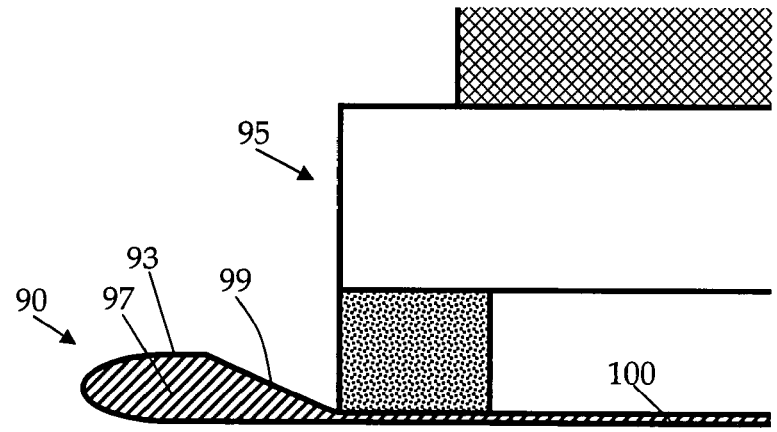
FIG. 10 is a partial side elevation view showing the wafer of FIG. 9 ground to include an edge support ring having an angled inner wall.

With reference to FIG. 9, a wafer 90 having a backside 93 is shown being ground by a grinding wheel 95 in accordance with the process 160. An edge support ring 97 and an angled inner wall 99 are shown being formed as the wafer backside 93 is ground and as the distance between the grinding wheel axis of rotation and the wafer chuck axis of rotation is gradually reduced. As shown in FIG. 10, the wafer 90 having an ultra thin central portion 100 and an edge support ring 97 having an angled inner wall 99 are formed by the process 160.

Figure 17:
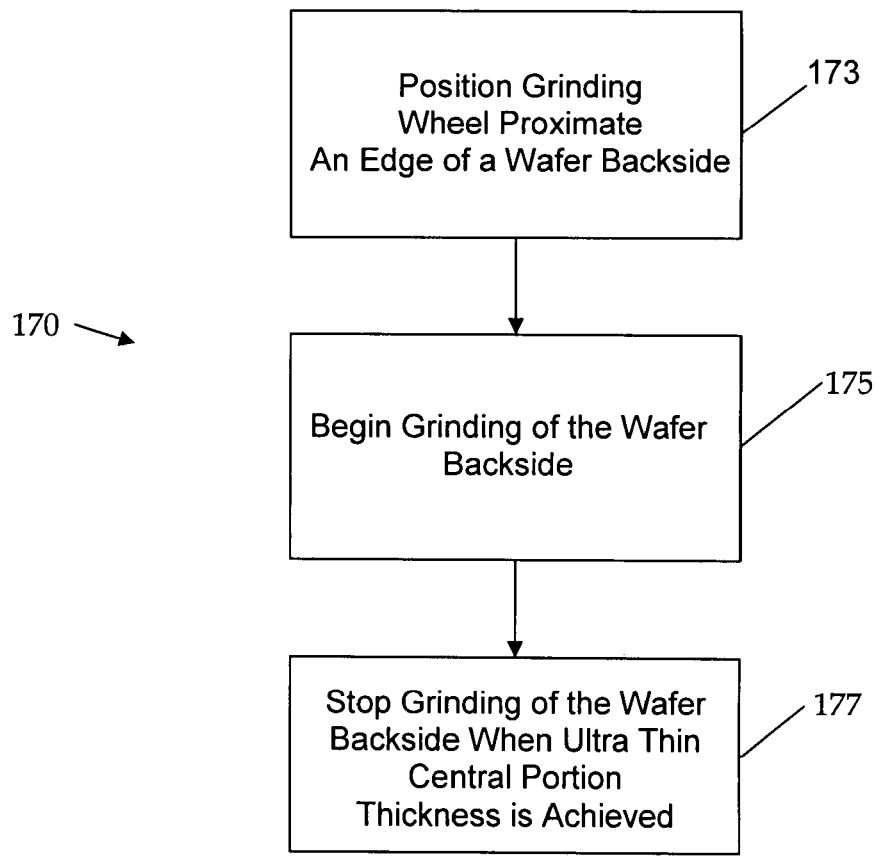
FIG. 17 is a flow chart of a process of forming ultra thin wafers having an edge support ring in accordance with the second aspect of the invention.

In accordance with a second aspect of a process of the invention, a process of forming ultra thin wafers having an edge support ring generally designated 170 is shown in FIG. 17. The process 170 uses a grinding wheel having an axis of rotation and a wafer chuck to which is secured the wafer, the wafer chuck having an axis of rotation. In a preferred embodiment of the invention, the axes of rotation of the grinding wheel and the wafer chuck are parallel. The grinding wheel has a plurality of teeth having an angled profile at an outside surface thereof. The angled profile preferably corresponds to a desired profile of an edge support ring angled inner wall. In a step 173, the grinding wheel is positioned proximate an edge of a wafer backside. By starting proximate the edge of the wafer, wafer material at the edge of the wafer is provided to form an edge support ring of substantially the same thickness of the original wafer and at least 2 mm wide. In a step 175, the wafer backside is ground forming the edge support ring having the angled inner wall. The process 170 ends in a step 177 when an ultra thin central portion thickness is achieved. After grinding many wafers, the teeth of the grinding wheel may become worn, necessitating an adjustment of the distance between the grinding wheel axis of rotation and the wafer chuck axis of rotation in step 173.

Figure 11:
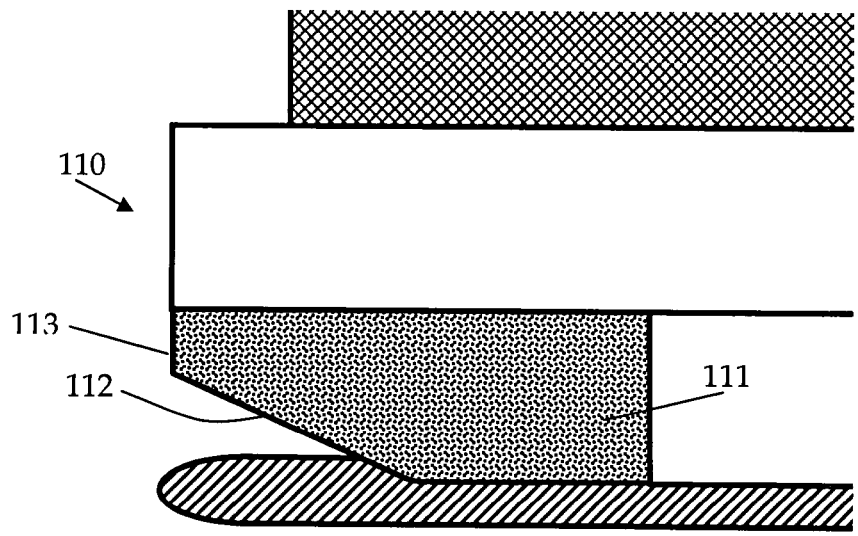
FIG. 11 is a partial side elevation view showing a wafer being ground in accordance with a second aspect of the invention.
Figure 12:
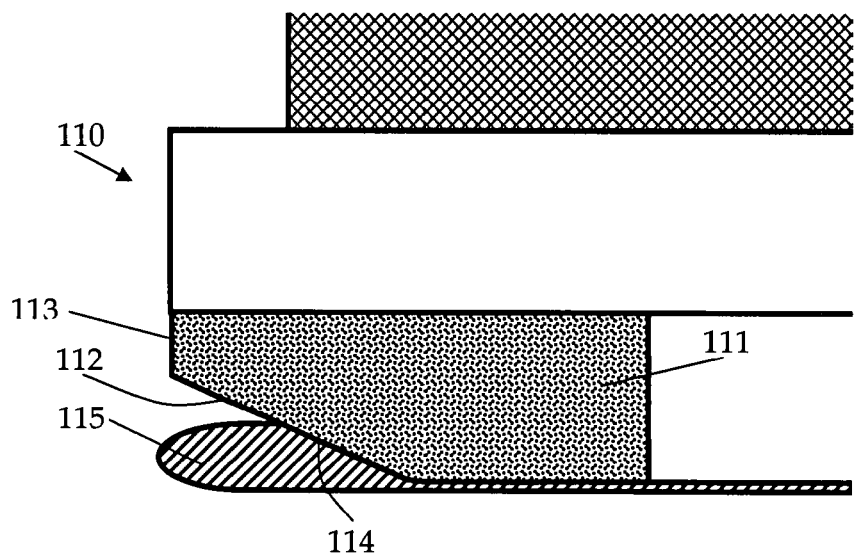
FIG. 12 is a partial side elevation view showing the wafer of FIG. 11 ground to include an edge support ring having an angled inner wall.

A grinding wheel 110 for use in the process 170 is shown in FIG. 11 and includes teeth 111 having an angled profile 112 at an outside surface 113 thereof. The angled profile 112 preferably corresponds to the desired profile of the angled inner wall 114 of the edge support ring 115 as shown in FIG. 12.

Figure 13:
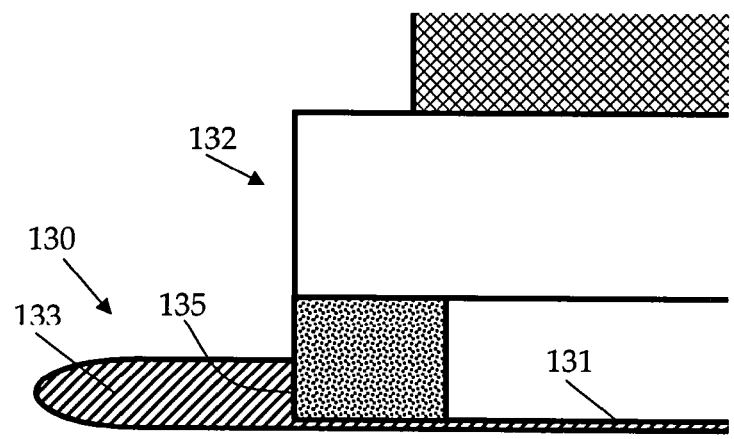
FIG. 13 is a partial side elevation view showing a wafer being ground in accordance with a third aspect of the invention.
Figure 14:
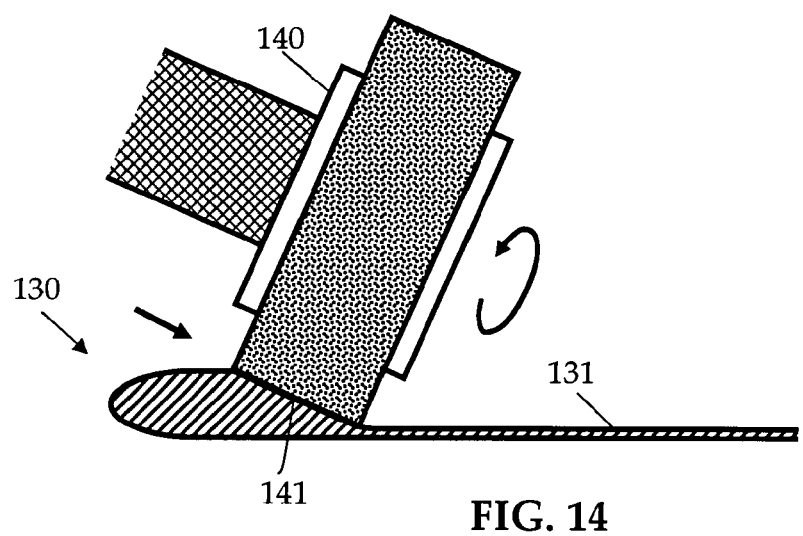
FIG. 14 is a partial side elevation view showing the wafer of FIG. 13 ground to include an edge support ring having an angled inner wall.
Figure 18:
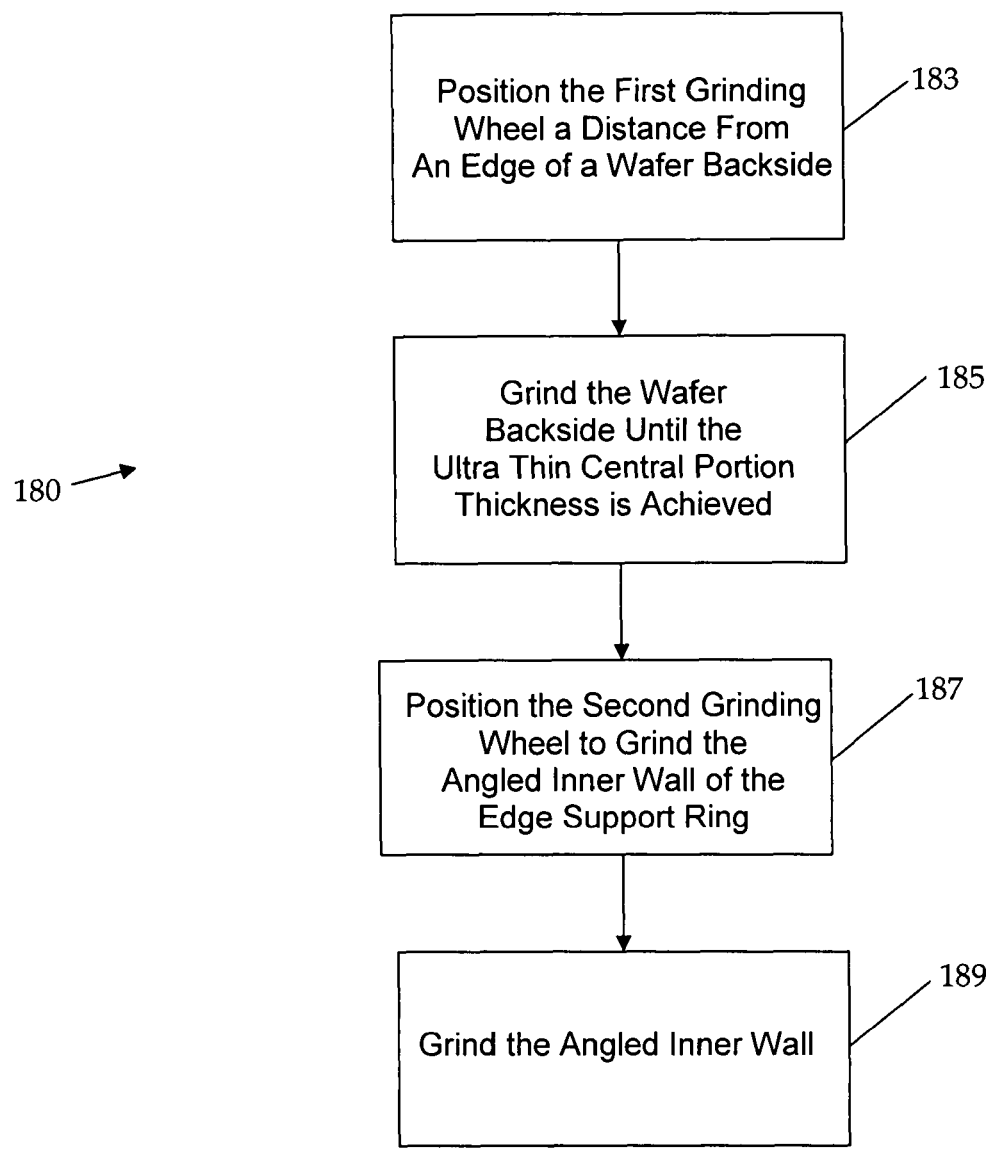
FIG. 18 is a flow chart of a process of forming ultra thin wafers having an edge support ring in accordance with the third aspect of the invention.

In accordance with a third aspect of a process of the invention, a process of forming ultra thin wafers having an edge support ring generally designated 180 is shown in FIG. 18. The process 180 uses two grinding wheels to form the edge support ring having an angled inner wall. In a first step 183, a first grinding wheel is positioned a distance from an edge of the wafer. In a preferred embodiment of the invention, the axes of rotation of the first grinding wheel and the wafer chuck are parallel. By starting a distance from the edge of the wafer, wafer material at the edge of the wafer is provided to form the edge support ring. In a step 185, a wafer backside is ground until the ultra thin central portion thickness is achieved. At this stage of the process 180, a wafer 130 having been ground using a first grinding wheel 132 includes an ultra thin central portion 131 and an edge support ring 133 having a substantially perpendicular wall 135 as shown in FIG. 13. Following step 185, a second grinding wheel is positioned at an angle to the substantially perpendicular wall to grind an angled inner wall of the edge support ring in a step 187. The angled inner wall is then ground in a step 189. The wafer 130 being ground by a second grinding wheel 140 is shown in FIG. 14. Grinding the perpendicular wall 135 forms an angled inner wall 141.

Figure 15:
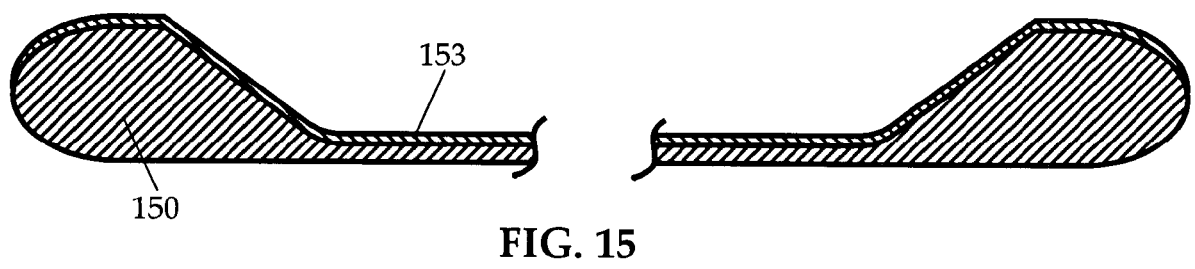
FIG. 15 is a partial side elevation view showing an ultra thin wafer with back metallization in accordance with the invention.

Processes 160, 170 and 180 may be employed to provide an angled inner wall having a linear profile such as that of angled inner wall 76 (FIG. 7). Processes 160 and 170 may be employed to provide a non-linear profile such as that of angled inner wall 86 (FIG. 8). Following the formation of the edge support ring having an angled inner wall in accordance with the invention, the wafer may be spin etched and the backside thereof metalized to provide an ultra thin wafer 150 having a back metal 153 as shown in FIG. 15.

The process of forming ultra thin wafers having an edge support ring in accordance with the invention provides ultra thin wafers having edge support rings compatible for use with conventional spin etch processes. The angled inner wall of the edge support ring provides a means by which etch chemicals and de-ionized water is spun from the wafer backside to thereby prepare the wafer for back metallization.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A process of forming an ultra thin wafer having an edge support ring comprising the steps of:

positioning a grinding wheel proximate a wafer backside edge;

grinding a periphery of the wafer backside while gradually reducing a distance between a grinding wheel axis of rotation and a wafer chuck axis of rotation, wherein the grinding wheel axis of rotation is parallel to the wafer chuck axis of rotation;

gradually decreasing feed depth of said grinding wheel as a function of said decrease in said distance between said wheel axis of rotation and said wafer chuck axis of rotation to create an ultra thin central portion and a peripheral edge support ring with an angled inner wall; and ending the grinding of the wafer backside when an ultra thin central portion thickness is achieved.

2. The process of forming the ultra thin wafer of claim 1, wherein the ultra thin central portion has a thickness of less than 4 mils.

* * * * *